United States Patent
Suzuki et al.

(10) Patent No.: US 8,362,595 B2
(45) Date of Patent: *Jan. 29, 2013

(54) MESA SEMICONDUCTOR DEVICE AND METHOD OF MANUFACTURING THE SAME

(75) Inventors: Akira Suzuki, Ota (JP); Katsuyuki Seki, Ojiya (JP); Keita Odajima, Fukaya (JP)

(73) Assignees: SANYO Semiconductor Co., Ltd., Ora-gun (JP); SANYO Semiconductor Manufacturing Co., Ltd., Ojiya-shi (JP); Semiconductor Components Industries, LLC, Phoenix, AZ (US)

( * ) Notice: Subject to any disclaimer, the term of this patent is extended or adjusted under 35 U.S.C. 154(b) by 328 days.

This patent is subject to a terminal disclaimer.

(21) Appl. No.: 12/338,686

(22) Filed: Dec. 18, 2008

(65) Prior Publication Data

US 2009/0160034 A1   Jun. 25, 2009

(30) Foreign Application Priority Data

Dec. 21, 2007   (JP) .................. 2007-330329

(51) Int. Cl.
*H01L 29/06* (2006.01)
*H01L 27/082* (2006.01)
*H01L 27/102* (2006.01)
*H01L 29/70* (2006.01)
*H01L 31/11* (2006.01)

(52) U.S. Cl. ......... 257/623; 257/618; 257/586; 257/626

(58) Field of Classification Search .................. 257/623, 257/624, 625, 626, 618, 586, 496, 494, 495, 257/600, 599, 622

See application file for complete search history.

(56) References Cited

U.S. PATENT DOCUMENTS 4,040,084 A   8/1977   Tanaka et al.
(Continued)

FOREIGN PATENT DOCUMENTS

JP   62-46534   2/1987
JP   2-44729   2/1990
(Continued)

OTHER PUBLICATIONS

Seki, K. et al., U.S. Office Action mailed on Jul. 26, 2010, directed to U.S. Appl. No. 12/354,620; 6 pages.

(Continued)

*Primary Examiner* — Chuong A. Luu
(74) *Attorney, Agent, or Firm* — Morrison & Foerster LLP

(57) ABSTRACT

The invention provides a mesa semiconductor device and a method of manufacturing the same which minimize the manufacturing cost and prevents contamination and physical damage of the device. An N− type semiconductor layer is formed on a front surface of a semiconductor substrate, and a P type semiconductor layer is formed thereon. An anode electrode is further formed on the P type semiconductor layer so as to be connected to the P type semiconductor layer, and a mesa groove is formed from the front surface of the P type semiconductor layer deeper than the N− type semiconductor layer so as to surround the anode electrode. Then, a second insulation film is formed from inside the mesa groove onto the end portion of the anode electrode. The second insulation film is made of an organic insulator such as polyimide type resin or the like. The lamination body made of the semiconductor substrate and the layers laminated thereon is then diced along a scribe line.

6 Claims, 4 Drawing Sheets

U.S. PATENT DOCUMENTS

| | | | |
|---|---|---|---|
| 4,227,975 | A | 10/1980 | Hartman et al. |
| 4,656,497 | A * | 4/1987 | Rogers et al. ............... 257/397 |
| 4,824,797 | A | 4/1989 | Goth |
| 4,974,050 | A | 11/1990 | Fuchs |
| 5,313,092 | A | 5/1994 | Tsuruta et al. |
| 5,726,086 | A | 3/1998 | Wu |
| 5,726,088 | A | 3/1998 | Yanagiya et al. |
| 5,882,986 | A | 3/1999 | Eng et al. |
| 6,127,720 | A | 10/2000 | Nakura et al. |
| 6,521,538 | B2 | 2/2003 | Soga et al. |
| 6,787,848 | B2 | 9/2004 | Ono et al. |
| 6,831,367 | B2 | 12/2004 | Sekine |
| 7,129,112 | B2 | 10/2006 | Matsuo |
| 7,380,915 | B2 | 6/2008 | Terui |
| 7,498,661 | B2 | 3/2009 | Matsuo |
| 7,646,015 | B2 | 1/2010 | Fujii et al. |
| 7,741,192 | B2 | 6/2010 | Shimoyama et al. |
| 7,776,672 | B2 | 8/2010 | Nakazawa et al. |
| 2003/0116532 | A1 | 6/2003 | Goldbach et al. |
| 2009/0160035 | A1 * | 6/2009 | Suzuki et al. ............... 257/623 |
| 2009/0189257 | A1 | 7/2009 | Seki et al. |

FOREIGN PATENT DOCUMENTS

| | | |
|---|---|---|
| JP | 2002-134523 | 5/2002 |
| JP | 2003-124478 | 4/2003 |
| JP | 2003-347306 A | 12/2003 |
| JP | 2004-296488 | 10/2004 |
| JP | 2005-51111 | 2/2005 |
| JP | 2005-276877 | 10/2005 |
| JP | 2006-12889 | 1/2006 |
| JP | 2006-156926 | 6/2006 |
| JP | 2006-287118 | 10/2006 |
| JP | 2006-310672 | 11/2006 |
| JP | 2007-180303 | 7/2007 |
| JP | 2007-207796 | 8/2007 |
| JP | 2007-305906 | 11/2007 |
| JP | 2008-10608 | 1/2008 |
| KR | 1999-003500 | 1/1999 |
| KR | 10-2003-0003089 | 1/2003 |
| TW | 417190 | 1/2001 |
| TW | 200415796 | 8/2004 |
| TW | I237343 | 8/2005 |
| TW | I266367 | 11/2006 |
| TW | I281442 | 5/2007 |
| WO | WO-03/077306 | 9/2003 |

OTHER PUBLICATIONS

Seki, U.S. Office Action mailed Oct. 25, 2010, directed to U.S. Appl. No. 12/354,620; 8 pages.

Suzuki, U.S. Office Action mailed Nov. 30, 2010, directed to U.S. Appl. No. 12/338,694; 10 pages.

Seki, K. et al., U.S. Office Action mailed Jun. 30, 2011, directed to U.S. Appl. No. 12/354,620; 8 pages.

Suzuki A., et al., U.S. Office Action mailed Apr. 12, 2011, directed to U.S. Appl. No. 12/338,694; 13 pages.

Suzuki, U.S. Office Action mailed Aug. 5, 2011, directed to U.S. Appl. No. 12/338,694; 14 pages.

Suzuki, A. et al., U.S. Office Action mailed Nov. 22, 2011, directed to U.S. Appl. No. 12/338,694; 6 pages.

* cited by examiner

MESA SEMICONDUCTOR DEVICE AND METHOD OF MANUFACTURING THE SAME

CROSS-REFERENCE OF THE INVENTION

This application claims priority from Japanese Patent Application No. 2007-330329, the content of which is incorporated herein by reference in its entirety.

BACKGROUND OF THE INVENTION

1. Field of the Invention

The invention relates to a mesa semiconductor device having a mesa groove and a method of manufacturing the same.

2. Description of the Related Art

A high power mesa diode is conventionally known as one of mesa semiconductor devices. A conventional mesa diode will be described referring to FIGS. 7 and 8. FIG. 7 is a schematic plan view of a semiconductor wafer where a plurality of conventional mesa diodes is disposed in a matrix. FIG. 8 is a cross-sectional view of FIG. 7 along line X-X, showing a state after dicing along a scribe line DL.

An N− type semiconductor layer 11 is formed on a front surface of an N+ type semiconductor substrate 10. A P type semiconductor layer 12 is formed on the front surface of the N− type semiconductor layer 11, and a first insulation film 23 is formed on the P type semiconductor layer 12. An anode electrode 14 electrically connected to the P type semiconductor layer 12 is further formed. A cathode electrode 15 is formed on the back surface of the semiconductor substrate 10.

A mesa groove 26 is formed from the front surface of the P type semiconductor layer 12 to the N+ type semiconductor substrate 10. The mesa groove 26 is formed deeper than the N− type semiconductor layer 11, of which the bottom is located in the N+ type semiconductor substrate 10. A second insulation film 47 fills the mesa groove 26 so as to cover the sidewall thereof including the PN junction JC of the N− type semiconductor layer 11 and the P type semiconductor layer 12 which are in contact. The mesa diode is surrounded by this mesa groove 26, forming a mesa structure. The scribe line DL of this mesa diode surrounds the mesa groove 26 on its outside.

A mesa semiconductor device is described in Japanese Patent Application Publication No. 2003-347306, for example.

In the conventional example described above, however, since the anode electrode 14 is exposed, water or the like enters the mesa diode from a gap between the anode electrode 14 and the first insulation film 23 to contaminate the mesa diode. Furthermore, the mesa diode is easily damaged physically.

For solving this problem, it is conceivable that a passivation film is further formed from the mesa groove 26 onto the end portion of the anode electrode 14 in addition to the second insulation film 47. In this case, however, the manufacturing process becomes complex by adding a process of forming the passivation film, and the manufacturing cost increases.

SUMMARY OF THE INVENTION

The invention provides a mesa semiconductor device that includes a semiconductor substrate having a first semiconductor layer of a first general conductive type and a second semiconductor layer of a second general conductive type formed on the front surface of the first semiconductor layer so as to have a PN junction between the first and second semiconductor layers, a first insulation film covering the front surface of the second semiconductor layer and having an opening, an electrode formed on the front surface of the second semiconductor layer so as to be in contact with the second semiconductor layer through the opening of the first insulation film, a mesa groove formed in the semiconductor substrate from the front surface of the second semiconductor layer to define a mesa on top of which the electrode is disposed, and a second insulation film filling the mesa groove and extending onto the front surface of the second semiconductor layer so as to cover the first insulation film and the end portion of the electrode.

The invention also provides a method of manufacturing a mesa semiconductor device. The method includes providing a semiconductor substrate having a first semiconductor layer of a first general conductive type and a second semiconductor layer of a second general conductive type formed on the front surface of the first semiconductor layer so as to have a PN junction between the first and second semiconductor layers, forming a first insulation film on the front surface of the second semiconductor layer so as to have an opening exposing the front surface of the second semiconductor layer, forming an electrode on the exposed front surface of the second semiconductor layer through the opening of the first insulation film, forming a mesa groove in the semiconductor substrate from the front surface of the second semiconductor layer to define a mesa on top of which the electrode is disposed, and forming a second insulation film so as to fill the mesa groove and extend onto the front surface of the second semiconductor layer to cover the first insulation film and the end portion of the electrode.

DETAILED DESCRIPTION OF THE INVENTION

Figure 1:
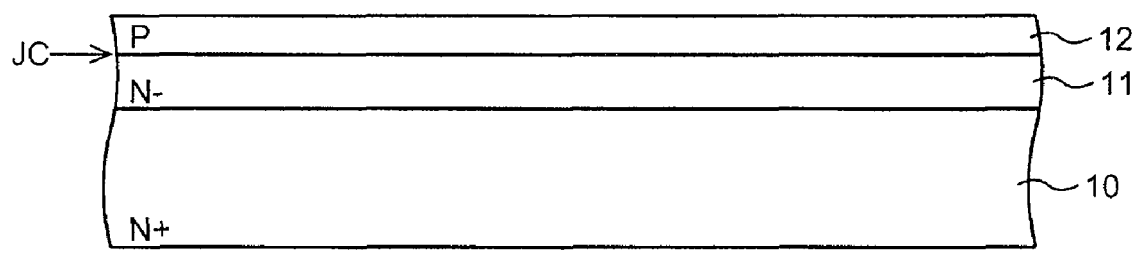
FIGS. 1 to 6 are cross-sectional views showing a mesa diode and a method of manufacturing the same of an embodiment of the invention.

A mesa semiconductor device of an embodiment of this invention and a method of manufacturing that device will be described using a mesa diode as an example. FIGS. 1 to 6 are cross-sectional views showing the mesa diode and the method of manufacturing the device and correspond to a cross-section of FIG. 7 along line X-X. In FIGS. 1 to 6, the same reference numerals are given to the same components as those shown in FIG. 7.

Figure 6:
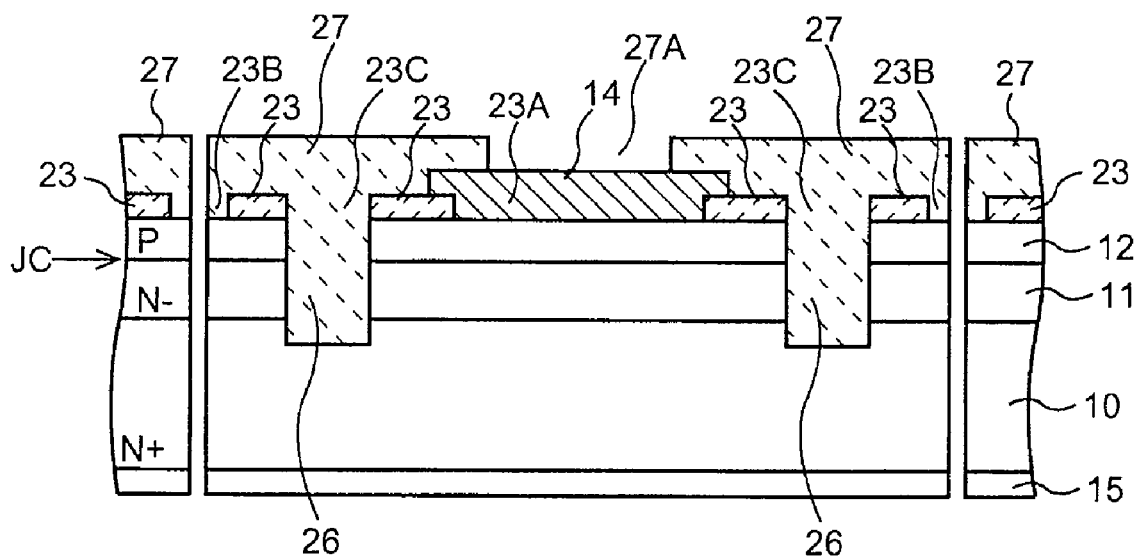
Figure 7:
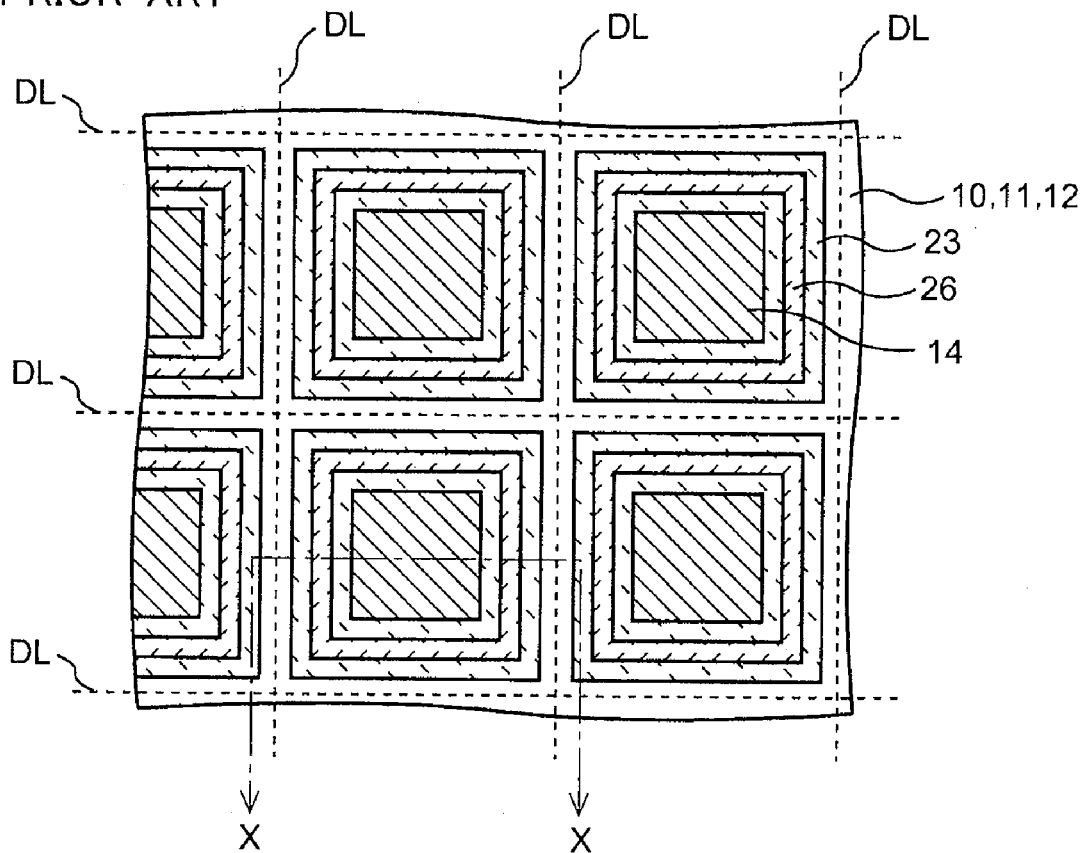
FIG. 7 is a plan view of a conventional mesa diode.
Figure 8:
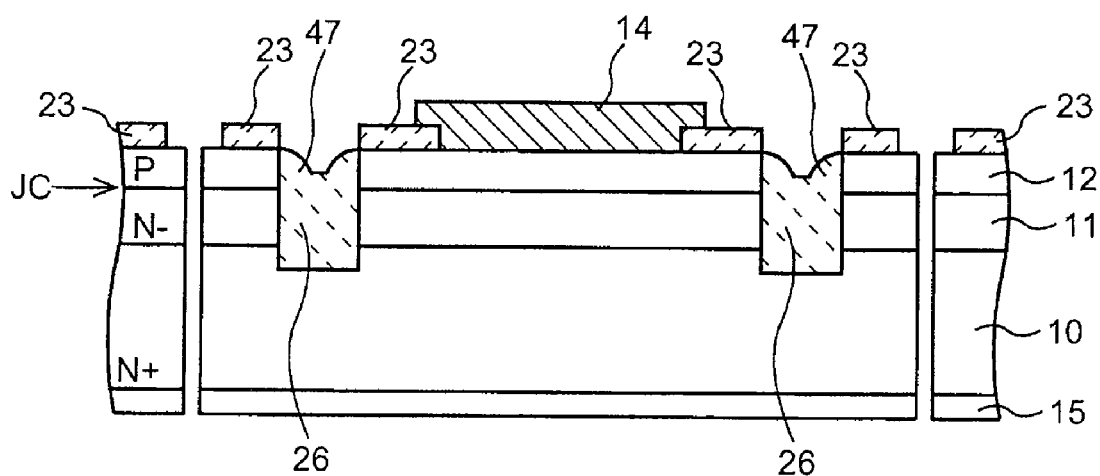
FIG. 8 is a cross-sectional view of the conventional mesa diode.

The method of manufacturing the mesa diode described below is conducted to a semiconductor wafer where a plurality of mesa diodes is to be disposed in a matrix as shown in FIG. 7. In FIGS. 1 to 6, for convenience of the description, one of plural mesa diodes is mainly shown and two mesa diodes adjacent to this are partially shown.

As shown in FIG. 1, an N+ type semiconductor substrate 10 (e.g. a silicon single crystal substrate) where a high concentration of N type impurity such as, for example, phosphorus is diffused is provided. A low concentration N type semiconductor layer, i.e., an N− type semiconductor layer 11 is formed on the front surface of the semiconductor substrate 10 by, for example, epitaxially growing a semiconductor layer. Instead of this, the N− type semiconductor layer 11 may be an impurity diffused region formed by diffusing an impurity in the front surface of the semiconductor substrate 10. Then, a P type semiconductor layer 12 is formed on the front surface of the N− type semiconductor layer 11 by, for example, diffusing a P type impurity such as boron. By this process, a PN junction JC is formed at the interface of the N− type semiconductor layer 11 and the P type semiconductor layer 12. In the structure described above, the total thickness of the semiconductor substrate 10, the N− type semiconductor layer 11 and the P type semiconductor layer 12 is about 200 μm, for example.

It is noted that conductivity types such as N+, N and N− belong in one general conductivity type, and conductivity types such as P+, P and P− belong in another general conductivity type.

Figure 2:
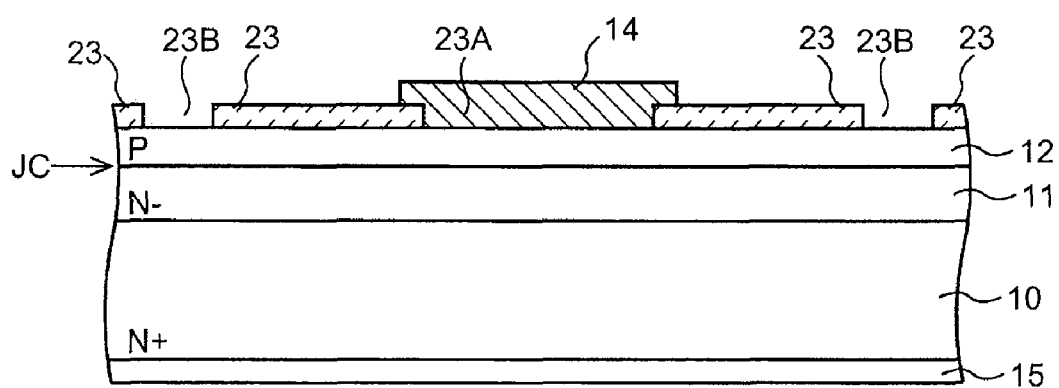

Then, as shown in FIG. 2, a first insulation film 23 such as a silicon oxide film is formed on the front surface of the P type semiconductor layer 12 by, for example, a thermal oxidation method or a CVD method. The first insulation film 23 is then partially etched using a mask to provide the first insulation film 23 with a first opening 23A and a second opening 23B exposing the P type semiconductor layer 12 partially. The first opening 23A corresponds to the active region of the mesa diode, and the second opening 23B corresponds to a scribe line region where a scribe line DL extends.

Then, an anode electrode 14 connected to the P type semiconductor layer 12 through the first opening 23A of the first insulation film 23 is formed. The anode electrode 14 is made of a conductive material such as aluminum and formed by a sputtering method, a vapor deposition method or the like. A cathode electrode 15 made of a conductive material such as aluminum is formed on the back surface of the semiconductor substrate 10 by the same method as the method of forming the anode electrode 14.

Figure 3:
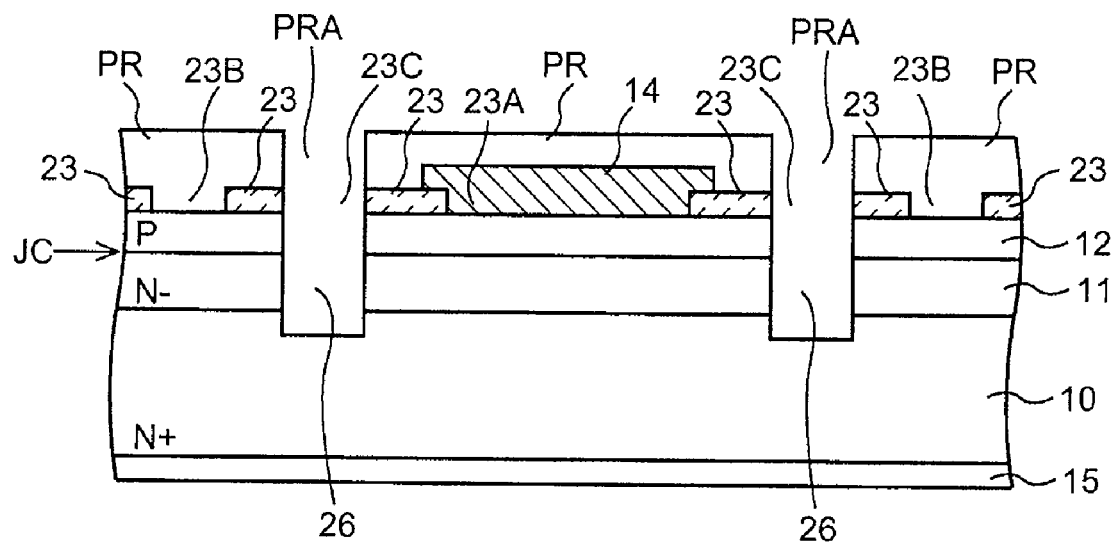

Then, as shown in FIG. 3, a resist layer PR covering the first insulation film 23 is formed. The resist layer PR has an opening PRA corresponding to a region for forming a mesa groove 26 which will be described below. Then, the first insulation film 23 exposed in the opening PRA is etched and removed using this resist layer PR as a mask to provide the first insulation film 23 with a third opening 23C. Then, the P type semiconductor layer 12, the N− type semiconductor layer 11 and the semiconductor substrate 10 are etched in a region reaching the middle of the semiconductor substrate 10 in the thickness direction using the resist layer PR as a mask, thereby forming the mesa groove 26 surrounding the active region of the mesa diode. In this etching, the mesa groove 26 having a high aspect ratio is obtained by using the Bosch process in which isotropic dry-etching and formation of a protection film are repeated, anisotropic dry-etching under extremely low pressure, or the like. The bottom of the mesa groove 26 is located deeper than the N− type semiconductor layer 11 and reaches the inside of the semiconductor substrate 10. The total depth is preferably about 100 μm. In other words, the mesa groove 26 reaches about half the depth of the stack of the semiconductor substrate 10 and the semiconductor layers 11 and 12. The width of the mesa groove 26 is about 10 μm, for example.

The mesa diode having such a mesa groove 26 has a high breakdown voltage when a reverse bias is applied, i.e., when a high voltage is applied from the cathode electrode 15 to the anode electrode 14 and a reverse bias is applied to the PN junction JC.

Figure 4:
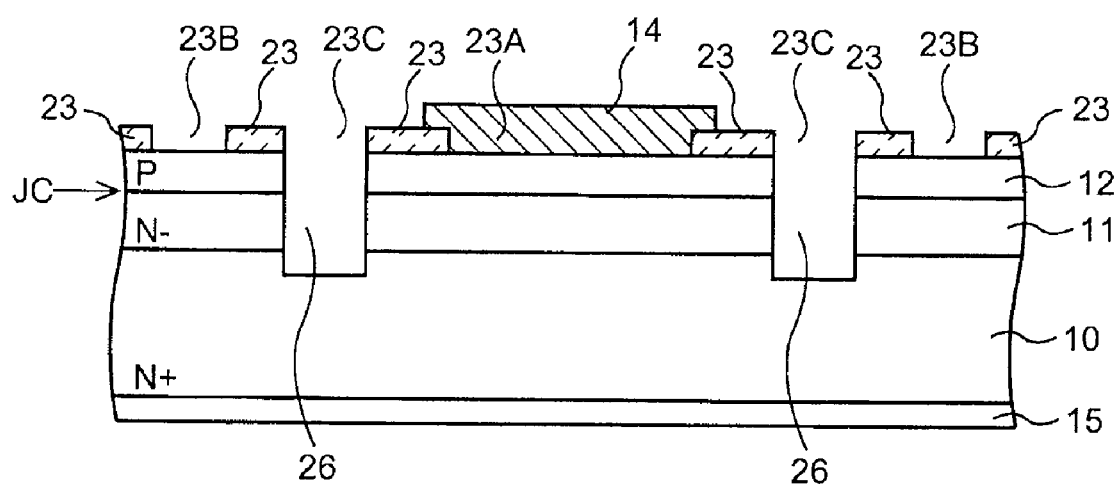
Figure 5:
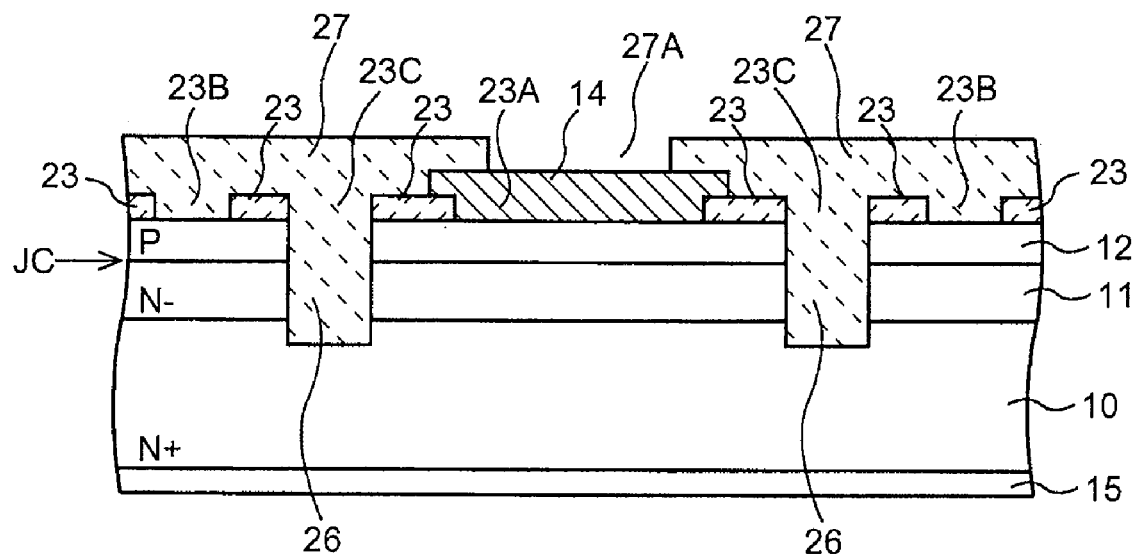

Then, the resist layer PR is removed as shown in FIG. 4, and then as shown in FIG. 5, a second insulation film 27 is formed continuously covering the P type semiconductor layer 12 exposed in the second opening 23B of the first insulation film 23 (i.e., in the scribe line region along the scribe line DL), the first insulation film 23, the inside of the mesa groove 26 and the end portion of the anode electrode 14. That is, the second insulation film 27 has an opening 27A exposing the anode electrode 14 except its end portion. A part of the second insulation film 27 extending on the end portion of the anode electrode 14 is at least about 50 μm from the end of the anode electrode 14, for example.

The second insulation film 27 is made of an organic insulator having, during its application to the substrate 10, a viscosity such that it fills the second opening 23B and the mesa groove 26 and continuously extends onto the anode electrode 14 therefrom. For example, a viscosity of 100 to 150 Pa·s during the application is good enough to achieve an appropriate coverage. After this application, the second insulation film 27 is cured, i.e., becomes more rigid. The second insulation film 27 contains polyimide type resin or epoxy type resin, for example. Alternatively, instead of the organic insulator described above, glass paste made by mixing lead or zinc type glass powder and resin may be used as the second insulation film 27 as long as it has the same viscosity as described above. The second insulation film 27 is formed by a screen printing method, a dispensing method or a spin coating method, for example, and patterned by a photolithography process or the like according to needs.

Then, as shown in FIG. 6, the lamination body made of the semiconductor substrate 10 and the layers laminated thereon is diced along the scribe line DL extending in the second opening 23B and separated into a plurality of mesa diodes.

Since the mesa diode completed in this manner is covered by the second insulation film 27 from inside the mesa groove 26 onto the end portion of the anode electrode 14 continuously, contamination of the inside of the mesa diode due to water entering it or the like and physical damage of the mesa diode are prevented without an additional passivation film. This eliminates a process of forming the additional passivation film, thereby minimizing the manufacturing cost.

Furthermore, since the second insulation film 27 fills the mesa groove 26 deeper than the N− type semiconductor layer 11, reaching the inside of the semiconductor substrate 10, it functions as a guard ring for preventing water entering the active region of the mesa diode.

The invention is not limited to the embodiment described above and modifications are possible within the scope of the invention. For example, in the above embodiment, the first insulation film 23 is not necessarily formed in the region on the outside of the mesa groove 26. In this case, in the region on the outside of the mesa groove 26, the second insulation film 27 is formed on the front surface of the P type semiconductor layer 12.

Furthermore, the N+ type semiconductor substrate 10, the N− type semiconductor layer 11 and the P type semiconductor layer 12 in the embodiment described above may be of opposite conductive types, respectively. Furthermore, the P type semiconductor layer may be formed directly on the N type semiconductor substrate. Furthermore, although the description is given using the mesa diode as an example in the embodiment described above, the invention may be applied to other mesa semiconductor devices. For example, the invention may also be applied to a mesa bipolar transistor, a mesa MOSFET, a mesa IGBT, a mesa thyristor or the like. In the case of the mesa bipolar transistor, for example, an NPN type bipolar transistor structure is obtained by further providing an N type semiconductor layer on the front surface of the P type semiconductor layer 12. Thus, with this structure, the second insulation film extending from the mesa groove covers a part of the electrode, thereby preventing contamination of the mesa semiconductor device due to water entering it or the like and physical damage of the mesa semiconductor device without an additional passivation film. Furthermore, this eliminates a process of forming the additional passivation film, thereby reducing the manufacturing cost.

What is claimed is:

1. A mesa semiconductor device comprising:
   a semiconductor substrate comprising a first semiconductor layer of a first general conductive type and a second semiconductor layer of a second general conductive type formed on a front surface of the first semiconductor layer so as to have a PN junction between the first and second semiconductor layers;
   a first insulation film covering a front surface of the second semiconductor layer and having an opening;
   an electrode formed on the front surface of the second semiconductor layer so as to be in contact with the second semiconductor layer through the opening of the first insulation film;
   a mesa groove formed in the semiconductor substrate from the front surface of the second semiconductor layer to define a mesa on top of which the electrode is disposed; and
   a second insulation film filling the mesa groove and extending onto the front surface of the second semiconductor layer so as to cover the first insulation film and an end portion of the electrode.

2. The mesa semiconductor device of claim 1, wherein the second insulation film comprises an organic insulator.

3. The mesa semiconductor device of claim 2, wherein the organic insulator comprises a polyimide or an epoxy resin.

4. The mesa semiconductor device of claim 1, wherein the mesa groove extends beyond the PN junction to reach the first semiconductor layer.

5. The mesa semiconductor device of claim 1, wherein the first semiconductor layer comprises a first layer and a second layer formed on a front surface of the first layer and having a lower concentration than the first layer, and the second layer is in contact with the second semiconductor layer.

6. The mesa semiconductor device of claim 5, wherein the mesa groove extends beyond the PN junction to reach the first layer of the first semiconductor layer.

* * * * *